(12) United States Patent
Palm et al.

(10) Patent No.: US 11,885,010 B2
(45) Date of Patent: Jan. 30, 2024

(54) PROCESS AND DEVICE FOR PRODUCING A CHALCOGEN-CONTAINING COMPOUND SEMICONDUCTOR

(71) Applicant: CNBM RESEARCH INSTITUTE FOR ADVANCED GLASS MATERIALS GROUP CO., LTD., Bengbu (CN)

(72) Inventors: Joerg Palm, Munich (DE); Thomas Niesen, Deisenhofer (DE); Erik Trabitzsch, Leipzig (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 89 days.

(21) Appl. No.: 17/609,423

(22) PCT Filed: May 6, 2020

(86) PCT No.: PCT/CN2020/088652
§ 371 (c)(1),
(2) Date: Nov. 8, 2021

(87) PCT Pub. No.: WO2020/224572
PCT Pub. Date: Nov. 12, 2020

(65) Prior Publication Data
US 2022/0228255 A1    Jul. 21, 2022

(30) Foreign Application Priority Data
May 6, 2019 (EP) .................................. 19172672

(51) Int. Cl.
*H01L 21/02* (2006.01)
*C23C 14/58* (2006.01)
(Continued)

(52) U.S. Cl.
CPC .......... *C23C 14/5866* (2013.01); *B01D 5/006* (2013.01); *B01D 5/009* (2013.01); *C23C 14/0623* (2013.01); *H01L 21/02568* (2013.01)

(58) Field of Classification Search
CPC .... B01D 5/006; B01D 5/009; C23C 14/0623; C23C 14/5866; H01L 21/02568
See application file for complete search history.

(56) References Cited

U.S. PATENT DOCUMENTS 8,728,200 B1 * 5/2014 Weiting ............... B01D 5/0093
                                                     95/193
9,084,969 B1 * 7/2015 Wieting .................... C01B 3/04
(Continued)

FOREIGN PATENT DOCUMENTS

CN    103572195 A    2/2014
JP    2005279640 A    10/2005
(Continued)

OTHER PUBLICATIONS

J. Palm, et al., CIS module pilot processing applying concurrent rapid selenization and sulfurization of large area thin film precursors, Thin Solid Films, 2003, pp. 514-522, 431-432.

*Primary Examiner* — Jaehwan Oh
(74) *Attorney, Agent, or Firm* — Bayramoglu Law Offices LLC

(57) ABSTRACT

A process for producing a chalcogen-containing compound semiconductor includes providing at least one substrate coated with a precursor for the chalcogen-containing compound semiconductor in a process chamber; heat treating the at least one coated substrate in the process chamber, wherein during a heat treatment, a gas atmosphere comprising at least
(Continued)

one gaseous chalcogen compound is provided in the process chamber; removing the gas atmosphere present after the heat treatment of the at least one coated substrate as a waste gas from the process chamber; cooling the waste gas in a gas processor, wherein a plurality of gaseous chalcogen compounds-present in the waste gas after the heat treatment of the at least one coated substrate are separated in time and space from one another from the waste gas by respective conversion into a liquid or solid form. Further provided is a device designed to carry out the process.

20 Claims, 1 Drawing Sheet

(51) Int. Cl.
*B01D 5/00* (2006.01)
*C23C 14/06* (2006.01)

(56) References Cited

U.S. PATENT DOCUMENTS

| 9,178,103 | B2 | 11/2015 | Wu et al. |
| 2010/0159135 | A1 | 6/2010 | Bent et al. |
| 2010/0226629 | A1 | 9/2010 | Basol et al. |
| 2014/0020386 | A1 | 1/2014 | Sakamoto et al. |
| 2017/0155005 | A1 | 6/2017 | Pan et al. |

FOREIGN PATENT DOCUMENTS

| JP | 2010158643 A | 7/2010 |
| JP | 2013105910 A | 5/2013 |
| JP | 2013203655 A | 10/2013 |
| JP | 2014062008 A | 4/2014 |
| JP | 2015524998 A | 8/2015 |
| JP | 2017144368 A | 8/2017 |
| JP | 2018093128 A | 6/2018 |
| KR | 20150080195 A | 7/2015 |
| WO | 2008072392 A1 | 6/2008 |

* cited by examiner

PROCESS AND DEVICE FOR PRODUCING A CHALCOGEN-CONTAINING COMPOUND SEMICONDUCTOR

CROSS REFERENCE TO THE RELATED APPLICATIONS

This application is the national stage entry of International Application No. PCT/CN2020/088652, filed on May 6, 2020, which is based upon and claims priority to European Patent Application No. 19172672.8, filed on May 6, 2019, the entire contents of which are incorporated herein by reference.

TECHNICAL FIELD

The present invention is in the technical field of the manufacture of thin-film solar cells and concerns a process and a device for the manufacture of a chalcogen-containing compound semiconductor which serves as an absorber for photoelectric conversion in thin-film solar cells.

BACKGROUND

In thin-film solar cells, the semiconducting material of the absorber used for photoelectric conversion is selected in such a way that the incident sunlight can be converted into electric current with good efficiency. Due to their physical properties and technological manageability, absorbers made of amorphous, micromorphous or polycrystalline silicon, cadmium telluride (CdTe), gallium arsenide (GaAs), copper-indiumum/gallium diselenide/disulfide/disulfoselenide (Cu(ln,Ga)(S,Se)2), copper-zinc-tin-sulfo-selenide (CZTS from the group of kesterites) and organic semiconductors are particularly suitable. The pentenary semiconductor $Cu(ln, Ga)(S,Se)_2$, which belongs to the group of chalcopyrite compound semiconductors, has gained special importance in the industrial series production of thin-film solar cells.

The manufacture of chalcogen-containing compound semiconductors, in particular absorbers made of $Cu(ln,Ga)(S,Se)_2$, is expediently carried out by a two-stage process. Such two-stage processes are known, for example, from J. Palm et al., "CIS module pilot processing applying concurrent rapid selenization and sulfurization of large area thin film precursors", Thin Solid Films 431-432, p. 414-522 (2003).

In a first step, a precursor of the chalcogen-containing compound semiconductor ("precursor") is deposited on a substrate, followed by a second step in which the substrate coated with the precursor is heat-treated in a gas atmosphere containing at least one chalcogen compound. The heat treatment, typically a so-called RTP heat treatment (RTP=Rapid Thermal Processing) or in a slower hatch furnace process, results in the crystal formation and phase transformation of the precursor to the semiconductor layer.

For the production of a chalcogen-containing compound semiconductor from Cu(ln,Ga)(S,Se)2,for example, a layer stack containing the metals copper, indium and gallium is deposited as a precursor, preferably by sputtering, on a glass substrate. Typically, but not necessarily, at least one chalcogen in elemental form (selenium and/or sulphur) is deposited as a further component of the precursor on the substrate by thermal evaporation. In these deposition processes, the temperature of the substrate is usually below 100° C., so that the elements are essentially retained unreacted as metal alloy and elemental chalcogen. The precursor is then thermally converted to the Cu(ln,Ga)(S,Se)2 compound semi- conductor by heating in an atmosphere containing at least one chalcogen compound. For example, the precursor contains only elemental selenium as chalcogen and the thermal reaction of the precursor takes place in an atmosphere containing only one sulfur compound as chalcogen. By the heat treatment of the precursor in an atmosphere containing chalcogen the crystallization and phase transformation of the precursor to the semiconductor layer can be obtained.

Correspondingly, a chalcogen-containing kesterite compound semiconductor can be produced by a two-step process, whereby a layer stack containing copper, zinc, tin and optionally at least one elemental chalcogen is applied to the substrate as a precursor. Subsequently, the precursor is converted to the compound semiconductor by heating in a gas atmosphere containing at least one chalcogen compound.

Typically, in such two-stage processes during the thermal conversion of the precursor to the chalcogen-containing compound semiconductor, at least one chalcogen compound is added in the gas atmosphere in the form of a hydrogen compound, for example hydrogen sulphide (dihydrogen sulphide, H2S) or hydrogen selenide (dihydrogen selenide, H2Se).

The heat treatment of the substrate coated with a precursor is carried out either in in-line systems or in stacking furnaces. In in-line systems, the coated substrate is successively fed to various process chambers arranged along a process line. In a typical configuration, such an in-line system includes a loading station, at least one heating chamber in which the coated substrates are heated rapidly at heating rates of several ° C./sec, and at least one cooling chamber in which the coated substrates are cooled and discharged from the system. In a stacking oven, many coated substrates are slowly heated, heat-treated and slowly cooled down again simultaneously in one oven.

In general, the production of a chalcogen-containing compound semiconductor is a cost intensive and technically demanding process that requires high temperatures, an exact temperature profile and a defined composition of the gas atmosphere if high efficiencies with sufficiently good reproducibility are to be achieved. For example, in the production of high-quality Cu(ln,Ga)(S,Se)2-compound semiconductors, the vapor pressure and the amount of at least one chalcogen compound in the gas atmosphere must be precisely controlled. In particular, a sufficient and defined amount of chalcogen is required to ensure complete sulfurization and/or selenization of the precursor. A significant loss of chalcogen would result in incomplete conversion of the precursor to the compound semiconductor. Even a weak chalcogen loss can still lead to recombination, i.e. loss of efficiency, and increased transients (especially vapor-heat losses) in the finished thin-film solar module. The use of transportable process boxes or stationary process hoods in the process chamber is useful for heat treatment, as they reduce the available process space compared to the chamber cavity. This makes it easier to maintain the desired process conditions.

The chalcogen-containing gases supplied during heat treatment, in particular hydrogen sulphide and hydrogen selenium, are extremely corrosive substances which attack metals at the high temperatures required during heat treatment. In addition, these gases are highly toxic, flammable and highly inflammable. In contact with mucous membranes they cause long-lasting irritations. This means that the waste gas produced in the process chamber during the heat treatment of the precursor must be cleaned, i.e. the chalcogen compounds contained in it must be removed as far as possible before it can be released into the external environment. This is necessary in the same way for both RTP processes and batch furnace processes. In particular, this cleaning is always necessary when chalcogen hydrogens are used as the chalcogen source.

Currently, the use of a gas scrubber (wet separator) for cleaning the waste gas produced during the heat treatment of the precursor is common. For this purpose, the waste gas is fed into a scabbing column and brought into contact with a liquid which absorbs the chalcogen-containing components of the waste gas. For example, an iron-containing, basic solution is used to absorb hydrogen sulphide or hydrogen selenide. This procedure is efficient and reliable. The remaining concentration of hydrogen sulphide or hydrogen selenide in the purified waste gas can be reduced to below 50 ppm. However, the resulting solid reaction product must be separated from the washing solution by pressure filtration and then disposed of as hazardous waste. To avoid this, the scrubbing solution can be subjected to a downstream treatment by aerobic microorganisms, whereby the sulphur-or selenium-containing substances are oxidized to sulphates. The washing solution can then be used as fertilizer without any problems. An alternative washing solution is, for example, diluted caustic soda lye mixed with hydrogen peroxide. Hydrogen peroxide is used to convert hydrogen sulphide or hydrogen selenide to sulphuric acid or selenic acid. The caustic soda lye neutralizes the resulting acids. The use of solid absorber materials in a dry separator is also known.

In general, the purification of the waste gas produced during the heat treatment of the pre-cursor for a chalcogen-containing compound semiconductor results in high costs, which significantly increase the overall costs for the production of thin-film solar cells. The situation is further aggravated by the fact that the chalcogen remaining in the waste gas is lost during the purification process and can no longer be reused. This is disadvantageous, especially since the useful rate of the at least one chalcogen compound provided in the gas atmosphere in the process chamber is relatively low anyway (e.g. 10%) and a sufficiently high content of chalcogen must always be ensured by introducing a process gas into the process chamber.

SUMMARY

The present invention aims at improving such a two-step process for the production of a chalcogen-containing compound semiconductor, whereby a cost-effective, simple and ecologically acceptable production of the compound semiconductor in a reliable and safe manner in the industrial series production of thin-film solar modules should be possible.

According to the proposal of the invention, these and further objects are solved by a process and device for producing a chalcogen-containing compound semiconductor with the features of the coordinated claims. Preferred embodiments of the invention are derived from the subordinate claims.

According to the invention, a process for producing a chalcogen-containing compound semiconductor is shown. The compound semiconductor serves as an absorber in thin-film solar cells for the photoelectric conversion of sunlight into electric current.

The process according to the invention is part of the manufacture of the thin-film solar cells of a thin-film solar module. The thin film solar module is preferably a thin film solar module with a composite pane structure, which has a cover pane and a rear pane (e.g. glass plates), which are firmly connected to each other by a thermoplastic or cross-linking polymer intermediate layer (e.g. PVB or EVA). The invention elates in particular to a thin-film-solar module in a substrate configuration, in which the layer structure for producing the thin-film solar cells is applied to a surface of a rear substrate facing the light-receiving side, or in a superstrate configuration, in which the layer structure is applied to a surface of a transparent cover pane facing away from the light-receiving side. The layer structure for thin-film solar cells comprises, in a manner known per se, a back electrode layer, a front electrode layer, and a photovoltaically active absorber layer arranged between the back and front electrode layers.

In line with common usage, the term "thin-film solar cell" refers to a layer structure used to manufacture thin-film solar cells with a very small thickness of, for example, a few micrometers, which generally requires a substrate for sufficient mechanical strength.

The substrate consists, for example, of glass, plastic, metal or a metal alloy and can be designed as a rigid plate or a flexible foil, depending on the thickness of each layer and the specific material properties. Preferably, the substrate consists of glass, especially soda-lime glass.

The precursor is used to produce a chalcogen-containing compound semiconductor, wherein the precursor is thermally converter (reacted) in a gas atmosphere containing at least one chalcogen compound to form the compound semiconductor. The thermal conversion of the precursor is carried out by heating the substrate coated with the precursor, typically by an RIP process or in a stack furnace process. For the purposes of the present invention, the term "coated substrate" means a substrate coated with a precursor for a chalcogen-containing compound semiconductor.

The precursor contains materials (metals and optionally at least one chalcogen) which are converted to the compound semiconductor in a gas atmosphere containing at least one chalcogen compound. The precursor is typically, but not necessarily, in the form of a stack of layers. It is also possible that the precursor consists of a single layer containing different materials. The elements of the 6th main group of the periodic table are called chalcogens. The compound semiconductor and optionally also its precursor contains at least one chalcogen, preferably sulphur and/or selenium.

Preferably the absorber is a chalcogen-containing chalcopyrite compound semiconductor, advantageously a ternary I-III-VI compound semiconductor from the group copper indium/gallium disulphide/diselenide, abbreviated by the formula $Cu(In,Ga)(S,Se)_2$. In the above formula, indium and gallium may each be present alone or in combination The same applies to the chalcogens sulfur and selenium, which can be present alone or in combination. CISe (copper indium diselenide), CIS (copper indium disulphide), CIGSe (copper indium gallium diselenide), CIGS (copper indium gallium disulphide) or CIGSSe (copper indium gallium disulphoselenide) are particularly suitable materials for the absorber.

Equally preferred, the absorber can be a chalcogen-containing kesterite compound semiconductor, preferably copper-zinc-tin-sulfoselenide (CZTS). The chalcogen-containing kesterite compound semiconductor contains at least one chalcogen, preferably sulphur and/or selenium.

The chalcogen-containing compound semiconductor is produced in a two-stage process. For example, to produce a $Cu(In,Ga)(S,Se)_2$ absorber layer on a substrate, especially after deposition of a back electrode layer, a precursor containing the elements copper, indium and gallium is first deposited on a substrate, preferably by sputtering. Furthermore, optionally a chalcogen in elemental form is applied, preferably selenium and/or sulphur, preferably by thermal evaporation. In these deposition processes, the temperature of the substrate is typically below 100° C., so that the elements are essentially retained unreacted as metal alloy and elemental chalcogen (selenium and/or sulphur). Subsequently, the precursor is reacted (thermally converted) to the Cu(ln,Ga)(S,Se)2 compound semiconductor by heating the coated substrate in a gas atmosphere containing at least one chalcogen compound. The at least one chalcogen compound is typically contained in the gas atmosphere in the form of a hydrogen compound, preferably hydrogen sulfide (dihydrogen sulfide, H2S) and/or hydrogen selenide (dihydrogen selenide, H2Se).

For example, the precursor contains only elemental selenium as chalcogen and the thermal reaction of the precursor takes place in an atmosphere that contains only one sulfur compound as chalcogen. However, the precursor can also contain, for example, only the metals copper, indium and gallium and the thermal reaction takes place in hydrogen chalcogen, for example first in H2Se and then in H2S (or vice versa) or in H2Se/H2S gas mixtures.

In a corresponding manner, a chalcogen-containing kesterite compound semiconductor can be produced in a two-stage process, whereby a precursor containing copper, zinc, tin and optionally at least one elemental chalcogen (preferably sulphur and/or selenium, particularly preferably only selenium) is first applied to the back electrode layer. The precursor is then converted to the compound semiconductor by heating the coated substrate in a gas atmosphere containing at least one chalcogen compound (preferably hydrogen sulphide (dihydrogen sulphide, H2S) and/or hydrogen selenide (dihydrogen selenide, H2Se).

In accordance with the invention, at least one substrate coated with a precursor for the production of a chalcogen-containing compound semiconductor is provided in a process chamber. The process space is formed by a gas-tight or (at least for the period of heat treatment of the precursor) at least approximately gas-tight enclosure into which at least one process gas can be introduced. The process space is for example the chamber cavity of a process chamber (heating chamber). Alternatively, it is also possible that the process space is reduced in relation to the chamber cavity, whereby the coated substrate is accommodated in a transportable process box or is covered by a stationary process hood arranged in the process chamber.

Subsequently, the at least one coated substrate is heat-treated (heated). The heat treatment results in a conversion of the precursor to the compound semiconductor, whereby during the heat treatment a gaseous atmosphere is provided in the process chamber which contains at least one gaseous chalcogen compound. The term "gaseous atmosphere" refers to the gaseous environment of the precursor, especially during the heat treatment of the precursor in the process space. The precursor is exposed to the gaseous atmosphere in the process chamber. The gaseous atmosphere in the process chamber is adjusted in the desired manner by introducing a process gas into the process chamber before and/or during the heat treatment of the 15 coated substrate. The supply of the process gas can be continuous or discontinuous. In addition to at least one gaseous chalcogen compound (preferably hydrogen sulphide (dihydrogen sulphide, $H_2S$) and/or hydrogen selenide (dihydrogen selenide, $H_2Se$), the process gas typically contains a further gas, preferably nitrogen ($N_2$), which serves to dilute the concentration of the gaseous chalcogen compound.

For heating the coated substrate in the process chamber, at least one energy source is arranged outside and/or inside the process chamber, the energy source preferably comprising at least one radiant heater for generating a heating radiation and being designed, for example, in the form of a radiant heater field with a one- or two-25 dimensional arrangement of radiant heaters. The coated substrate can be heated directly by impinging heating radiation and/or indirectly heated (heat conduction, heat radiation) by surfaces heated by the heating radiation, for example surfaces of a process box. Typically, the precursor is heated at high heating rates of several ° C. per second. Alternatively, the precursor is heat treated in a stacking furnace. For this purpose, a large number of coated substrates are stacked in cassettes which are moved into the process chamber of the stacking furnace. Here, the heating takes place slowly via the heated walls of the furnace chamber. For homogeneous heating, convection in the oven can be forced.

After the heat treatment of the precursor and the conversion into the chalcopyrite or kesterite semiconductor absorber, a gaseous atmosphere is present in the process chamber, which contains the at least one gaseous chalcogen compound which was provided in the gaseous atmosphere during the heat treatment of the coated substrate. However, at least one further gaseous chalcogen compound may also be present in the gas atmosphere, which was formed by a chalcogen contained in the precursor. For example, if the precursor contains elemental selenium and hydrogen sulphide is provided during the heat treatment, the waste gas may also contain hydrogen selenide by chemical conversion. The gas mixture may also contain nitrogen or another gas as carrier or purge gas, as well as small traces of oxygen or water vapour.

In accordance with the invention, the gas atmosphere is removed from the process chamber after heat treating the at least one precursor-coated substrate before the process chamber is loaded with at least one further precursor-coated substrate. A new gas atmosphere is provided for the heat treatment of at least one further (not yet heat-treated) coated substrate, for which purpose a process gas is typically introduced into the process chamber before and during the heat treatment of the at least one coated substrate. Preferably at least 90% of the gas atmosphere, advantageously at least 99% of the gas atmosphere, is removed from the process space before at least one further coated substrate is introduced into the process space. The gas atmosphere can be removed by purging and diluting with an inert gas such as nitrogen or by pumping and flooding with an inert gas.

For the purpose of the present invention, the term "waste gas" means the gas atmosphere removed from the process chamber after heat treatment of at least one coated substrate.

According to the invention, it is essential that the waste gas is cleaned, whereby several (i.e. two or more) gaseous chalcogen compounds, which are present in the waste gas after heat treatment of the coated substrate, are separated from the waste gas by respective conversion into a liquid or solid form. Separation of the chalcogen compounds is carried out such that the chalcogen compounds are separated from each other in time and space (location), i.e. the chalcogen compounds are separated from the waste gas successively (one after the other) and in different places. The waste gas contains the at least one gaseous chalcogen compound which was provided in the process chamber during the heat treatment of the at least one coated substrate. However, the waste gas typically also contains one or more other gaseous chalcogen compounds that were formed during the heat treatment.

For this purpose, the waste gas is cooled so that all gaseous chalcogen compounds contained in the waste gas are converted into either a liquid or solid form (i.e. state of aggregation). It is advantageous to remove the major part of a respective chalcogen compound contained in the waste gas by conversion into a liquid or solid form from the waste gas, whereby preferably at least 90%, particularly preferably at least 99%, even more preferably at least 99.99%, of the chalcogen compound is removed from the waste gas. Preferably a respective chalcogen compound is only contained in gaseous form in the waste gas in a concentration of less than 50 ppm after cooling of the waste gas, so that the purified waste gas can also be released to the external environment.

Thus, the waste gas can be cleaned by cooling in a particularly simple, cost-effective and ecological way, whereby several gaseous chalcogen compounds are separated from the waste gas either by solidification or liquefaction. In addition, further use of the separated (recycled) chalcogen compounds is possible.

According to the invention, the waste gas is cooled to below the boiling point or melting point of the chalcogen compounds in the waste gas, whereby the chalcogen compounds contained in the waste gas in gaseous form are successively liquefied or solidified. By converting the gaseous chalcogen compounds in the waste gas to the liquid or solid aggregate state, they can be separated from the waste gas. For the purposes of this invention, the term "separated chalcogen compound" means a chalcogen compound separated from the waste gas by liquefaction or solidification.

Since two or more gaseous chalcogen compounds are present in the waste gas, the waste gas is cooled to below the lowest boiling point or melting point of the chalcogen compounds in order to gradually liquefy or solidify all chalcogen compounds. For this purpose, the various gaseous chalcogen compounds are each converted into a liquid or solid form, separated in time and/or space from one another. In this way, individual or all chalcogen compounds can be selectively separated from the waste gas (cryogenic separation). Accordingly, different chalcogen compounds are separated from each other in time and space separately from the waste gas according to the process according to the invention. This can be achieved in a simple manner by cooling the waste gas below the different boiling points or melting points of the chalcogen compounds contained in the waste gas at separate times and places, if the waste gas is cooled so that its temperature is between two different boiling points of two chalcogen compounds, the liquefied chalcogen compound with the higher boiling point can be separated from the waste gas (and discharged by the gas processor). If the waste gas is further cooled to a temperature below the lower boiling point, the liquefied chalcogen compound with the lower boiling point can be separated from the waste gas (and discharged by the gas processor). The same applies to the melting points of the chalcogen compounds. This measure allows selective disposal or further use of separated chalcogen compounds in an advantageous way, i.e. chalcogen compounds can be recovered and recycled separately. Specifically, one or more chalcogen compounds can be selectively removed.

The waste gas typically contains at least two chalcogen compounds. If, for example, only one gaseous chalcogen compound has been provided in the gas atmosphere, e.g. hydrogen sulphide, the waste gas usually also contains hydrogen selenium, which is formed from selenium present in the precursor. If hydrogen sulphide is separated from the waste gas and returned (recycled) to the process area in gaseous form, the recycled gas inevitably also contains hydrogen selenium, since hydrogen selenium has a higher boiling point than hydrogen sulphide. As a result, hydrogen selenium increasingly accumulates in the process area, which can significantly change the process conditions in the process area and make the entire process unstable. In order to avoid this, the recycled gas would have to be dieted again and again, but this only reduces the inaccuracies and increases the process costs. According to the invention, hydrogen sulphide and hydrogen selenide can be separated from the waste gas, so that the aforementioned disadvantage does not occur. This is a major advantage of the invention.

The waste gas is cooled in at least one gas processor equipped for this purpose with a gas cooling device with at least one cooling zone (contact surface for the gas). The gas processor may additionally or alternatively have a gas heating device by which a liquefied or solidified separated chalcogen compound (after spatial separation from the waste gas to avoid mixing with the waste gas) can be vaporised again.

For example, at least two gas processors are provided, to which the waste gas is fed one after the other. The gas processors each have at least one cooling zone (contact surface for gas), whereby the temperature of the cooling zones to which the waste gas is fed in succession becomes increasingly colder. In each gas processor at least one, in particular exactly one, gaseous chalcogen compound is separated from the waste gas. Preferably only one single gas processor is provided, which has several (two or more) different cooling zones (contact surfaces for gas) with different temperatures. The waste gas is fed to the various cooling zones in succession, the temperature of the cooling zones becoming increasingly colder, so that at least one, in particular exactly one, gaseous chalcogen compound is separated at each cooling zone.

In accordance with an embodiment of the process according to the invention, at least one separated chalcogen compound is removed from the gas processor during the continued cooling of the waste gas, i.e. spatially separated from the waste gas. This design can be easily realized by liquefying at least one chalcogen compound, since a liquid can be easily removed from the waste gas, for example by pumping. In particular, at least one liquefied chalcogen compound is continuously removed during the continued cooling of the waste gas. However, non-continuous removal of at least one liquefied chalcogen compound is also possible. The spatial separation of at least one separated chalcogen compound from the waste gas and the cooling of the waste gas are therefore carried out simultaneously. At least one separated chalcogen compound that has been removed can, for example, be fed to another gas processor equipped with a gas heating device and can be evaporated in it. The waste gas can be cleaned by continuous cooling until the content of a particular chalcogen compound falls below a desired maximum limit. At least one separated chalcogen compound can be discharged from the gas processor at the same time.

According to an alternative design of the process according to the invention, at least one separated chalcogen compound and the waste gas are spatially separated from each other only after the waste gas has been cooled. The cooling of the waste gas and the spatial separation of at least one separated chalcogen compound and the waste gas are thus not carried out simultaneously but successively. It is also possible that the waste gas is drawn off from at least one separated chalcogen compound, i.e. the waste gas is drawn off from the gas processor used for cooling, whereby at least one separated chalcogen compound remains in the gas processor. For example, at least one separated chalcogen compound remaining in the gas processor is vaporized in the gas processor, for which purpose the gas processor is provided with a gas heating device. However, it is also possible that at least one separated chalcogen compound is discharged from the gas processor and waste gas remains in the gas processor. At least one discharged separated chalcogen compound may, for example, be fed to another gas processor which is provided with a gas heating device and evaporated therein This design is particularly advantageous when at least one chalcogen compound is solidified, as it is more difficult to discharge a solid from the gas processor than it is with a liquid. After spatial separation of waste gas and at least one separated chalcogen compound, the waste gas can be subjected to further cooling. This can be repeated until the content of a particular chalcogen compound falls below a desired maximum limit.

When a chalcogen compound is liquefied in the gas processor, the vapour pressure above the liquid is still relatively high, so that the yield is lower than in a solidification process, in which the vapour pressure above the solid is only very low. Conversion to the solid state can be advantageous in this respect, but recovery in continuous operation is more difficult.

For example, in a gas processor with at least two cooling zones (contact surfaces for gas),the waste gas is cooled successively at the cooling zones and at each cooling zone at least one, in particular exactly one, chalcogen compound is separated from the waste gas. Each separated chalcogen compound can be selectively removed by the gas processor.

According to a preferred embodiment of the process according to the invention, at least one separated chalcogen compound is re-evaporated after spatial separation from the (remaining) waste gas, i.e. brought into the gaseous aggregate state. This can be advantageous for storage purposes. A particular advantage, however, is the possibility of returning at least one evaporated. separated chalcogen compound to the process chamber for the heat treatment of another substrate. According to a particularly advantageous embodiment of the process according to the invention, at least one separated chalcogen compound is fed in gaseous form to the process chamber before and/or during the heat treatment of a coated substrate.

In accordance with an embodiment of the process according to the invention, at least one, in particular exactly one, separated chalcogen compound is fed to at least one buffer tank. The storage in the buffer tank enables a simple subsequent disposal or further use of the at least one (recycled) chalcogen compound. The at least one separated chalcogen compound can be stored in the buffer tank in gaseous, liquid or solid aggregate state. The temperature and/or pressure in the buffer tank can be adjusted accordingly. It is advantageous to store at least one separated chalcogen compound in gaseous form in the buffer tank, especially in order to then be fed into the process room for the heat treatment of at least one coated substrate.

The process according to the invention can in particular take place in at least two temporal phases: in a first phase several chalcogen compounds are liquefied or frozen out by cooling in the gas processor and in the second phase at least one separated liquid or the at least one solid is evaporated again in the same gas processor or in a further gas processor and fed to the buffer tank. If only one gas processor is used, no further waste gas can be introduced during evaporation, so that the waste gas either remains in the process chamber or can be temporarily stored in a further buffer tank. If a second gas processor is used, the waste gas can be cleaned in one gas processor, while in the other gas processor at least one separated chalcogen compound is provided for further use by heating.

According to an embodiment of the process according to the invention, vaporous water is separated from the gaseous chalcogen compounds from the waste gas. The vaporous water is separated from the waste gas separated from the chalcogen compounds in time and space. Preferably, the liquefied or solidified water is discharged from the gas processor before a gaseous chalcogen compound is solidified or liquefied by further cooling of the waste gas. Due to the considerably higher boiling and melting point of water compared to chalcogen compounds, the vaporous water is usually first separated from the waste gas when cooling the waste gas. If the liquid or solid water is removed from the gas processor before a chalcogen compound is separated from the waste gas, the separated chalcogen compound is advantageously at least largely water-free. Therefore, particularly pure chalcogen compounds can be recovered.

At least one separated chalcogen compound can be returned to the process chamber in gaseous form. This allows considerable cost savings, as the material input for the at least one chalcogen compound used in the gas atmosphere is reduced. In addition, this measure is very sensible from an ecological point of view, as the amount of hazardous waste is reduced. The chalcogen compound separated from the waste gas can be mixed with a dilution gas, for example nitrogen, in order to adjust the chalcogen compound content in a targeted manner. It is also possible that several chalcogen compounds separated from the waste gas are returned to the process chamber. This may facilitate the process, as certain chalcogen compounds may not need to be recovered According to a preferred embodiment of the process according to the invention, the waste gas in the gas processor is cooled by contact with cooled contact surfaces which have a different temperature (contact cooling). The contact surfaces are preferably cooled by a (circulating) liquid or solid cooling medium, preferably liquid nitrogen.

The invention further relates to a device for producing a chalcogen-containing compound semiconductor, which is suitably configured for carrying out the process according to the invention.

The device comprises a process chamber for providing at least one coated substrate coated with a precursor for a chalcogen-containing compound semiconductor. The process space may be a chamber cavity of the process chamber. It is also possible that the process space is formed by a transportable process box or a process hood arranged stationary in the process chamber. It is also possible that the process chamber is a stacking furnace containing one or more cassettes, each containing several coated substrates to be heat treated together.

The device further comprises at least one energy source for the heat treatment of the at least one coated substrate in the process chamber, which is embodied, for example, in the form of one or more radiant heaters for generating a heating radiation.

The device further comprises at least one gas supply line for feeding a process gas containing at least one chalcogen compound into the process space.

The device further comprises at least one gas discharge line for removing a gas atmosphere after heat treatment of the at least one coated substrate from the process space, which represents the waste gas to be cleaned.

The device further comprises at least one gas processor. The at least one gas processor is provided with a gas cooling device for cooling the waste gas and converting at least one chalcogen compound contained in the waste gas into a liquid or solid form and/or with a gas heating device for evaporating the liquefied or solidified at least one chalcogen compound separated from the waste gas. In any case, the device has at least one gas processor with a gas cooling device. Optionally, a gas processor may, in addition to a gas cooling device, also include a gas heating device. A gas processor may also have only a gas heating device (and no gas cooling device).

Advantageously, at least two gas processors are provided, wherein at least one gas processor is configured for cooling the waste gas and at least one gas processor for evaporating the liquefied or solidified at least one chalcogen compound separated from the waste gas. Each of the at least two gas processors can be designed to cool the waste gas and to evaporate the liquefied or solidified at least one chalcogen compound separated from the waste gas.

Preferably, at least two gas processors are operated cyclically in time: while in one gas processor the gas mixture is separated from the process space by liquefaction or freezing, in the other gas processor the separated liquids or solids are reheated and fed to the buffer tank.

For example, the device has at least two gas processors to which the waste gas is fed successively, whereby in each gas processor at least one, in particular exactly one, gaseous chalcogen compound can be separated from the waste gas. The device may also comprise a single gas processor which is provided with at least two cooling zones (contact surfaces for gas), wherein at least one, in particular exactly one, gaseous chalcogen compound can be separated from the waste gas at each cooling zone.

In particular, a gas processor preferably has a cooling device which has at least one coolable contact surface, in particular several coolable contact surfaces, for the waste gas, which can be advantageously cooled by a liquid cooling medium circulating within a cooling circuit, in particular liquid nitrogen. The gas processors may also have built-in heat sources (electrical heating elements or supplied fluid heat carriers) in order to convert the liquid or solid chalcogen compounds back into the gaseous state. In particular, the gas processors may be provided with receptacles for the separated chalcogen compound assigned to the respective contact surfaces, for example in the form of a sump.

In accordance with an embodiment of the device according to the invention, the device has at least one buffer tank coupled to the gas processor in a fluid-conducting (fluidic) manner for storing at least one chalcogen compound removed from the waste gas. The buffer tank can be designed in particular for storing two or more chalcogen compounds, preferably in separate form.

According to an embodiment of the device according to the invention, the at least one gas processor and/or the at least one buffer tank are fluidically coupled with a gas supply line into the process chamber. It is possible that the process space has a first gas supply line which serves to introduce a primary process gas containing at least one chalcogen compound not separated from the waste gas into the process space via the first gas supply line, and that the process space has a second gas supply line which serves to introduce a second process gas containing (or consisting of) at least one chalcogen compound separated from the waste gas into the process space. The first gas supply line and the second gas supply line can also be combined into a common gas supply line. In particular, the primary process gas and the secondary process gas may be mixed before or during the introduction into the process area.

For the configuration of the device for the production of a chalcogen-containing compound semiconductor for carrying out the process according to the invention, reference is additionally made to the above statements on the process according to the invention.

The various embodiments of the invention may be realised individually or in any combination. In particular, the features mentioned above and those to be explained below can be used not only in the combinations indicated but also in other combinations or in a unique position without leaving the scope of the present invention.

BRIEF DESCRIPTION OF THE DRAWINGS

The invention is now explained in more detail with reference to the attached figures. The depict:

FIG. 1 shall be considered first, which, by means of a schematic diagram, illustrates a device for the manufacture of a chalcogen-containing compound semiconductor, designated as a whole by the reference number 1.

Figure 1:
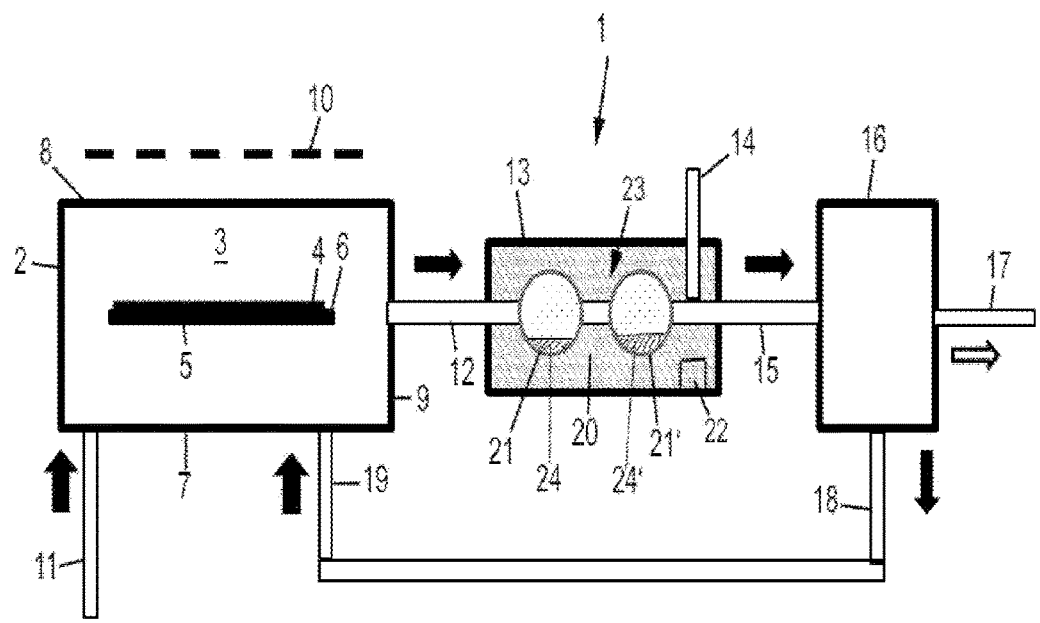
FIG. 1 a schematic representation of an embodiment of the device for producing a chalcogen-containing compound semiconductor.

LIST OF REFERENCE SIGNS 1 device
2 process chamber wall
3 process chamber
4 precursor
5 substrate
6 surface
7 bottom wall
8 top wall
9 side wall
10 radiator field
11 first gas supply line
12 gas discharge line
13 gas processor
14 gas outlet
15 connecting line
16 buffer tank
17 first buffer tank outlet
18 second buffer tank outlet
19 second gas supply line
20 cooling chamber
21 contact surface (cooling zone)
22 heating device
23 cooling device
24, 24' receptacle

DETAILED DESCRIPTION OF THE EMBODIMENTS

The device 1 comprises a process chamber wall 2, formed for example by a process box or a furnace chamber, and delimits a process chamber 3, which is used to accommodate at least one substrate 5 coated with a precursor 4. The precursor 4 is deposited on a surface 6 of the substrate 5 and serves for the production of a chalcogen-containing compound semiconductor. The process wall 2 comprises a bottom wall 7, a top wall 8, and a side wall 9, which connects bottom wall 7 and top wall 8 with each other and also serves as a spacer for bottom wall 7 and top wall 8.

Bottom wall 7, top wall 8 and side wall 9 together form the process chamber 3, in which the substrate 5 coated with a precursor 4 can be subjected to heat treatment. The substrate 5, for example, lies on the inner side of bottom wall 7. If the process chamber wall 2 is formed by a process box, bottom wall 7, top wall 8 and side wall 9 can be detachably connected to each other. If the process chamber wall 2 is formed by a stacking furnace, bottom wall 7, top wall 8 and side wall 9 can be firmly connected to each other. In particular, process chamber wall 2 can also be formed by a tube furnace.

The at least one substrate 5 is for example a glass plate. A back electrode layer (not shown in detail) is applied to the surface 6 of substrate 5. On the hack electrode layer is the precursor 4, which is to be thermally converted to a chalcogen-containing compound semiconductor. For example, for the production of a Cu(ln,Ga)(S,Se)2-Absorber layer, the precursor 4 consists of different individual layers containing copper, indium and gallium, which are applied by sputtering, for example. Furthermore, the precursor 4 can also contain a chalcogen in elemental form, preferably selenium and/or sulphur, which is preferably applied by thermal evaporation. The precursor 4 is reacted by heating in a gas atmosphere containing at least one chalcogen compound in process chamber 3, preferably a selenium and/or sulphur compound, to form the Cu(ln,Ga)(S,Se)$_2$ compound semiconductor. For example, the precursor 4 contains as chalcogen only elemental selenium and the thermal reaction of the precursor takes place in a gas atmosphere which contains as chalcogen only sulfur in a sulfur compound (e.g. hydrogen sulfide). The thermal conversion of the precursor 4 takes place in process chamber 3.

Adjacent to and immediately neighboring the top wall 8 is a radiator field 10 as an energy source with a large number of heating radiators (e.g. halogen lamps, infrared radiators or surface radiators) placed in a one- or two-dimensional arrangement (array) for emitting heating radiation for heating the top of the precursor 4. Similarly, adjacent to and immediately neighboring the bottom wall 7 is another radiator array as a bottom side energy source, which for the sake of simplicity is not shown in FIG. 1. In a stacking oven, preferably also the side wall 9 is heated by energy sources. The radiant heaters of the radiator array 10 emit a heating radiation which partially passes the (here for example partially transparent) top wall 8 and hits the precursor 4. Part of the heating radiation is absorbed by the top wall 8, which heats the top wall 8, which in turn emits heat radiation which in turn heats the precursor 4. A bottom-side heating of the precursor 4 by the (not shown) bottom-side radiator field is done in the same way. In a stack oven with several substrates, the heat energy must also be supplied to the internal substrates by convection.

After depositing the substrate 5 coated with the precursor 4 in process chamber 3 or after inserting cassettes with several coated substrates, process chamber 3 is closed and filled with a (primal) process gas containing at least one chalcogen compound via a first gas supply line 11 opening into process chamber 3. The coated substrate 5 is then tempered at a tempering rate of several ° C. per second, for example 5° C./sec. In a stacking furnace, the several substrates are heated rather slowly in order to achieve uniform heating by convection and radiation and to avoid glass breakage and glass bending. During the tempering of the coated substrate 5, the primary process gas can still be fed into process chamber 3, if necessary. For example, the precursor 4 contains only selenium (Se) as chalcogen and hydrogen sulphide (H$_2$S) diluted by gaseous nitrogen (N$_2$) is fed into process chamber 3 as the primary process gas. Alternatively, no chalcogen is contained in the precursor and H2Se and H2S are fed as primary process gases. The feeding of the primary process gas into process chamber 3 is illustrated in FIG. 1 by an arrow next to the first gas supply line 11.

After completion of the heat treatment of the precursor 4 and conversion of the precursor 4 to the chalcogen-containing compound semiconductor, the gas atmosphere in process chamber 3 is drawn off from process chamber 3 by gas discharge line 12 leading into process chamber 3. The extraction of the gas atmosphere from process chamber 3 is illustrated in FIG. 1 by an arrow above the gas discharge line 12. The extracted gas atmosphere is the waste gas to be cleaned.

For this purpose the gas discharge line 12 is connected to a gas processor 13 in a fluid-conducting manner. By means of the gas discharge line 12 the waste gas is led into the gas processor 13. The gas processor 13 serves for active cooling of the waste gas, whereby several chalcogen compounds, in particular the at least one chalcogen compound (here e.g. hydrogen sulphide and/or hydrogen selenide) supplied in the primary process gas, are removed from the waste gas by at least 99%. For this purpose, the waste gas is cooled to below the boiling point of the respective chalcogen compound so that the chalcogen compound is liquefied and can be separated from the waste gas. The waste gas can also be cooled to below the melting point of the respective chalcogen compound so that it is temporarily separated as a solid. The waste gas cleaned in this way can now be discharged to the external environment via gas outlet 14.

The gas processor 13, only shown schematically, comprises a cooling device 23 with a cooling chamber 20 into which the waste gas can be introduced. The cooling chamber 20 is provided with cooled contact surfaces 21, 21' which serve to cool the waste gas. The contact surfaces 21, 21' are cooled by a respective cooling medium, here for example a liquid cooling medium circulating within a cooling circuit, in particular liquid nitrogen. The waste gas is fed to the two contact surfaces 21, 21' in succession the two contact surfaces 21, 21' having a different temperature. The downstream contact surface 21' in the direction of flow of the waste gas has a lower temperature than the upstream contact surface 21. At each contact surface 21, 21' a chalcogen compound is separated from the waste gas. For example, hydrogen selenide is separated at the first contact surface 21 and hydrogen sulphide at the second contact surface 21'. Each contact surface 21, 21' forms a cooling zone for the waste gas. The contact surfaces 21, 21' each have a receptacle 24, 24' (sump) for the separated (e.g. liquid) chalcogen compound, which is schematically illustrated in FIG. 1.

At least one chalcogen compound separated from the waste gas (recycled) is transferred from the gas processor 13 to a buffer tank 16 through connecting line 15. This is illustrated only schematically in FIG. 1. In particular, connecting line 15 can also be configured as two separate fluid lines in order to feed both separated (e.g. liquid) chalcogen compounds in the receptacles 24, 24' of the contact surfaces 21, 21' separately to the buffer tank 16. The transfer of at least one recycled chalcogen compound to the buffer tank 16 is illustrated in FIG. 1 by an arrow above connecting line 15.

At least one liquefied or solidified chalcogen compound may be removed by the gas processor 13 during or after cooling of the waste gas, in particular without being transported into the buffer tank 16. In particular in the case of liquefaction, removal from the gas processor 13 is also possible coring the cooling of the waste gas, in particular continuously. In case of condensation of at least one chalcogen compound as a solid, the gas processor 13 can be operated cyclically in two phases. In a first phase at least one chalcogen compound is separated from the waste gas by solidification. In a second phase, the solid is vaporised and can be removed by the gas processor 13, in particular collected in the buffer tank 16. Not shown in FIG. 1, but preferred, is the use of at least two gas processors 13, one gas processor 13 being used for cooling the waste gas and separating at least one chalcogen compound, while in the other gas processor the separated at least one chalcogen compound is evaporated.

It would also be possible, instead of a single gas processor 13 with two contact surfaces 21, 21', to provide two gas processors, each with a single contact surface, whereby the waste gas is fed to the two gas processors one after the other.

In the buffer tank 16 at least one recycled chalcogen compound can be stored in gaseous, liquid or solid form, depending on the pressure and temperature in the buffer tank 16; in particular in the liquid and solid state, the at least recycled chalcogen compound can be easily transferred for further use or disposal, which is illustrated by a first buffer tank cutlet 17 and the arrow below it. In case of storage in gaseous form, the recycled chalcogen compound can be fed directly to process chamber 3. Otherwise, prior evaporation is required. In particular, two recycled chalcogen compounds can be stored separately in buffer tank 16.

Furthermore, the buffer tank 16 has a second buffer tank outlet 18, which is fluidically connected to a second gas supply line 19 leading into process chamber 3. Via the second gas supply line 19, at least one, and in particular exactly one, recycled chalcogen compound (e.g. hydrogen sulphide) can be introduced into process chamber 3 in gaseous form as secondary process gas. This is illustrated by an arrow next to the second buffer tank outlet 18. In particular, the content of chalcogen compound in the primary process gas can be reduced in this way, so that the amount of chalcogen compound (e.g. hydrogen sulphide) added to the primary process gas during the heat treatment of at least one further coated substrate 5 can be reduced. This saves a considerable amount of material and costs. The feeding of the recycled chalcogen compound as secondary process gas into process chamber 3 is illustrated by an arrow next to the second gas supply line 19. It is conceivable that the recycled chalcogen compound is mixed with a dilution gas, for example nitrogen (N2), in order to specifically adjust the amount of chalcogen compound in the secondary process gas. It is also possible that the secondary process gas and the primary process gas are mixed before being introduced into process chamber 3, whereby in particular the concentration of chalcogen compound(s) can be adjusted by the dilution gas of the primary process gas. The second gas supply line 19 can then be dispensed with. The connecting lines are suitably protected by valves. In this way the cyclic operation can also be controlled. Preferably, only a single chalcogen compound is fed into the process chamber (e.g. hydrogen sulphide), whereby the further chalcogen compound separated from the waste gas (e.g. hydrogen selenium) is used elsewhere or disposed of. In this way the process conditions can be kept stable, whereby in particular an accumulation of hydrogen selenium in the process area is avoided.

It is understood that the gas processor schematically illustrated in FIG. 1 may also have more than two contact surfaces (cooling zones), in particular to separate more than two gaseous chalcogen compounds from the waste gas.

During the heat treatment of precursor 4, the chalcogen in precursor 4 may (to a small extent) pass into the gas atmosphere, so that the waste gas may also contain a chalcogen compound due to chalcogen from precursor 4. This chalcogen compound can also be separated from the waste gas in the gas processor 13, either together with the at least one chalcogen compound of the first process gas or alone. It is possible that a mixture of chalcogen compounds separated from the waste gas is stored in the buffer tank 16 and/or fed to the process chamber 3, which may facilitate the process control. Similarly, it is possible to separate vaporous water from the waste gas.

Optionally, the gas processor 13 is equipped with a heating device 22 for accelerated maintenance, but also for the recovery (evaporation) of a liquefied or condensed chalcogen compound.

Figure 2:
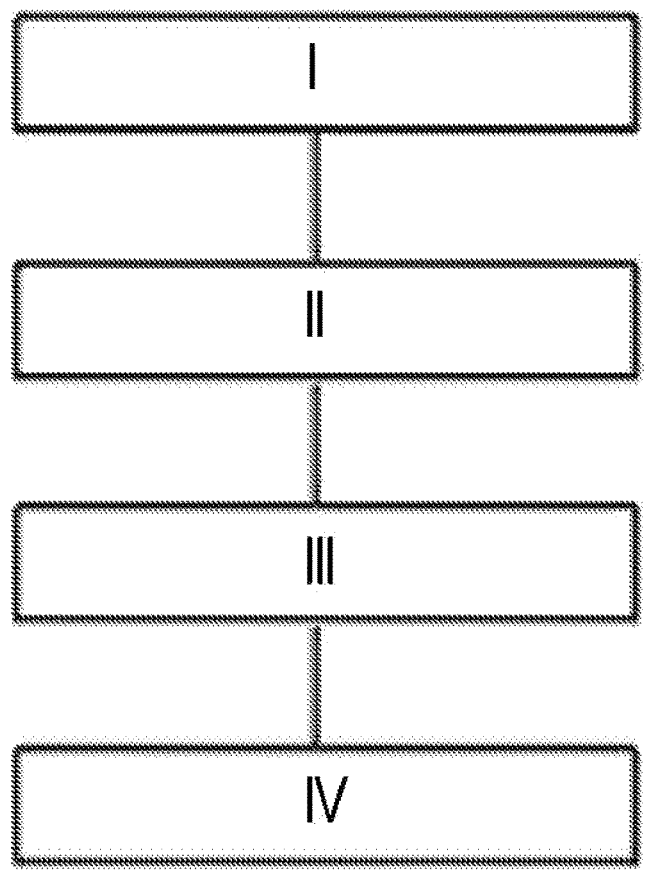
FIG. 2 a flow chart illustrating the process steps of the process according to the invention for producing a chalcogen-containing compound semiconductor.

FIG. 2 shows a flowchart illustrating the process of manufacturing a chalcogen-containing compound semiconductor.

Accordingly, in a first step I a substrate 5 coated with a precursor 4 for the chalcogen-containing compound semiconductor is provided in a process chamber 3. In a second step II, the precursor 4 is heat-treated in process chamber 3, wherein a gas atmosphere comprising at least one chalcogen compound is provided in process chamber 3 during the heat treatment. In a third step III, after heat treatment of the precursor 4, the gaseous atmosphere present in process chamber 3 is removed as waste gas, and in a fourth step the waste gas is purified, wherein a plurality of chalcogen compounds contained in the waste gas (the gaseous chalcogen compounds which were provided in the gas atmosphere during the heat treatment of the at least one coated substrate and/or were formed during the heat treatment) are at least partially removed from the waste gas by cooling the waste gas and liquefying or solidifying the chalcogen compounds.

Cryogenic separation of chalcogen compounds from the waste gas can be easily achieved by means of the gas processor 13. The table below lists the melting and boiling points of sample components of the waste gas:

| | Melting point [° C.] | Boiling point [° C.] |
|---|---|---|
| $H_2O$ | 0 | 100 |
| $H_2Se$ | −66 | −41 |
| $H_2S$ | −86 | −60 |
| $N_2$ | −210 | −195.8 |
| $O_2$ | −218.8 | −183 |

Thus, by increasing the cooling of the waste gas to temperatures below 0° C., residual water (H2O) can initially be intercepted. Subsequently, at temperatures around the boiling point of hydrogen selenide (−41° C.) and hydrogen sulphide (−60°), these (toxic) gases can be separated from the waste gas, whereby individual separation is possible in particular when cooling to intermediate temperatures. By cooling the waste gas to temperatures below the melting points of hydrogen selenide (−66° C.) and hydrogen sulphide (−86° C.), these compounds can also be frozen out, whereby nitrogen (N2) and oxygen (O2) remain gaseous. The temperature of liquid nitrogen is a maximum of −195.8° C., so that the cooling surfaces of cooling device 23 can be cooled well for cryogenic separation of the chalcogen compounds.

As follows from the above, the invention provides an improved process and a corresponding device for the production of a chalcogen-containing compound semiconductor in which the waste gas produced during the heat treatment of the precursor can be cleaned by cooling in a simple and inexpensive manner (cryogenic separation of chalcogen compounds).

In a particularly advantageous manner, one or more of the recycled chalcogen compounds can be reused, especially as (secondary) process gas in the heat treatment of at least one further coated substrate. In the production of thin-film solar cells, this can lead to considerable savings in material and costs. In addition, the process according to the invention is very advantageous from an ecological point of view due to the recycling of toxic chalcogen 10 compounds and the resulting reduction of hazardous waste.

What is claimed is:

1. A method of producing a chalcogen-containing compound semiconductor, comprising:
    providing at least one substrate coated with a precursor for the chalcogen-containing compound semiconductor in a process chamber to obtain at least one coated substrate, wherein the precursor comprises at least one metal and at least one chalcogen,
    heat treating the at least one coated substrate in the process chamber, wherein during a heat treatment, a gas atmosphere comprising at least one gaseous chalcogen compound is provided in the process chamber,
    removing the gas atmosphere present after the heat treatment of the at least one coated substrate as a waste gas from the process chamber,
    cooling the waste gas in a gas processor below the boiling point or melting point of the chalcogen compounds in the waste gas, wherein the at least one gaseous chalcogen compound or a plurality of gaseous chalcogen compounds present in the waste gas after the heat treatment of the at least one coated substrate are separated from the waste gas in time and space by a respective conversion into a liquid or solid form.

2. The method according to claim 1, wherein the plurality of gaseous chalcogen compounds present in the waste gas after the heat treatment of the at least one coated substrate are separated from the waste gas by the respective conversion into the liquid or solid form separated in time and space from one another.

3. The method according to claim 1, wherein the at least one gaseous chalcogen compound separated from the waste gas is removed from the gas processor during cooling of the waste gas.

4. The method according to claim 1, wherein the at least one gaseous chalcogen compound separated from the waste gas or the waste gas is discharged from the gas processor after cooling the waste gas.

5. The method according to claim 1, wherein the at least one gaseous chalcogen compound separated from the waste gas is evaporated.

6. The method according to claim 1, wherein the at least one gaseous chalcogen compound separated from the waste gas is fed to at least one buffer tank.

7. The method according to claim 1, wherein the at least one gaseous chalcogen compound is hydrogen sulphide.

8. The method according to claim 1, wherein a vaporous water contained in the waste gas is separated from the at least one gaseous chalcogen compound present in the waste gas by conversion into the liquid or solid form.

9. The method according to claim 1, wherein a mixture of the plurality of gaseous chalcogen compounds separated from the waste gas is fed to the process chamber in a gaseous form.

10. A device for producing the chalcogen-containing compound semiconductor by the method according to claim 1, comprising:
    the process chamber for providing the at least one substrate, wherein the at least one substrate is coated with the precursor for the chalcogen-containing compound semiconductor, wherein the precursor comprises at least one metal and at least one chalcogen,
    at least one energy source for the heat treatment of the at least one coated substrate in the process chamber, wherein the energy source for the heat treatment comprises a radiant heater that emits heating radiation that heats the precursor,
    at least one gas supply line for supplying a process gas containing the at least one gaseous chalcogen compound into the process chamber,
    at least one gas discharge line for discharging the gas atmosphere from the process chamber as the waste gas,
    at least one gas processor, wherein the waste gas is cooled, and the at least one gaseous chalcogen compound or the plurality of gaseous chalcogen compounds present in the process chamber after the heat treatment of the at least one coated substrate are separated from the waste gas by the conversion into the liquid or solid form in the at least one gas processor.

11. The device according to claim 10, wherein the process chamber is connected to the at least one gas processor, wherein the at least one gas processor is designed to sequentially separate the plurality of gaseous chalcogen compounds from the waste gas in time and space from one another.

12. The device according to claim 10, further comprising at least one heating device for vaporizing the at least one gaseous chalcogen compound separated from the waste gas in the liquid or solid form.

13. The device according to claim 10, further comprising at least one buffer tank fluidly coupled to the at least one gas processor for storing the at least one gaseous chalcogen compound separated from the waste gas.

14. The device according to claim 10, wherein the at least one gas processor or at least one buffer tank is coupled in a fluid-conducting manner with the at least one gas supply line into the process chamber.

15. The device according to claim 10, wherein the process chamber is connected to at least two gas processors, wherein a first gas processor of the at least two gas processors is configured to separate the at least one gaseous chalcogen compound from the waste gas by cooling to obtain a separated gaseous chalcogen compound, and a second gas processor of the at least two gas processors is configured to evaporate the separated gaseous chalcogen compound.

16. The method according to claim 2, wherein the plurality of gaseous chalcogen compounds separated from the waste gas is removed from the gas processor during cooling of the waste gas.

17. The method according to claim 2, wherein the plurality of gaseous chalcogen compounds separated from the waste gas or the waste gas are discharged from the gas processor after cooling the waste gas.

18. The method according to claim 3, wherein the at least one gaseous chalcogen compound separated from the waste gas or the waste gas is discharged from the gas processor after cooling the waste gas.

19. The method according to claim 2, wherein the plurality of gaseous chalcogen compounds separated from the waste gas are evaporated.

20. The method according to claim 3, wherein the at least one gaseous chalcogen compound separated from the waste gas is evaporated.

\* \* \* \* \*